(12) United States Patent
Matsutani (10) Patent No.: US 7,316,972 B2
(45) Date of Patent: Jan. 8, 2008

(54) CONTACT HOLE FORMATION METHOD (75) Inventor: Tetsuya Matsutani, Kyoto (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/630,681

(22) Filed: Jul. 31, 2003

(65) Prior Publication Data
US 2004/0067630 A1 Apr. 8, 2004

(30) Foreign Application Priority Data
Aug. 30, 2002 (JP) .............................. 2002-254317

(51) Int. Cl.
*H01L 21/4763* (2006.01)
(52) U.S. Cl. ............................... 438/622; 257/E21.077
(58) Field of Classification Search ........ 438/585–587, 438/598–599, 624
See application file for complete search history.

(56) References Cited
U.S. PATENT DOCUMENTS

| | | | |
|---|---|---|---|
| 5,441,915 A * | 8/1995 | Lee ............................. | 438/631 |
| 5,549,786 A * | 8/1996 | Jones et al. ................. | 438/723 |
| 5,656,556 A * | 8/1997 | Yang ........................... | 438/646 |
| 5,789,313 A * | 8/1998 | Lee ............................. | 438/599 |
| 5,893,750 A * | 4/1999 | Hause ......................... | 438/633 |
| 6,110,775 A | 8/2000 | Fujii et al. | |
| 6,184,121 B1 * | 2/2001 | Buchwalter et al. ......... | 438/622 |
| 6,271,117 B1 * | 8/2001 | Cherng ........................ | 438/624 |
| 6,329,251 B1 * | 12/2001 | Wu ............................. | 438/275 |
| 6,350,665 B1 * | 2/2002 | Jin et al. ..................... | 438/585 |
| 6,518,130 B1 * | 2/2003 | Ohno ........................... | 438/275 |
| 2002/0055250 A1 * | 5/2002 | Jain ............................ | 438/624 |

FOREIGN PATENT DOCUMENTS

JP 9-266252 10/1997

(Continued)

OTHER PUBLICATIONS

English Abstract of WO 97/12393 corresponding to JP 11-512877.

(Continued)

*Primary Examiner*—Michael Lebentritt
*Assistant Examiner*—Andre' Stevenson
(74) *Attorney, Agent, or Firm*—Wenderoth, Lind & Ponack, L.L.P.

(57) ABSTRACT

A contact hole formation method includes a process of depositing a BPSG film 4 on a semiconductor substrate 1 on which transistors are formed, a process of planarizing the BPSG film 4, a process of depositing a dielectric film 5 on the BPSG film 4, and a process of forming contact holes 8 through the BPSG film 4 and the dielectric film 5 so as to reach the semiconductor substrate 1, in a case in which gate electrodes are densely formed in some areas and sparsely formed in other areas. The above-described contact hole formation method allows a thickness of the BPSG film 4 to be uniform irrespective of the density of the gate electrodes, whereby an etching rate becomes uniform over the entire area of the semiconductor device. Thus, it is possible to form contact holes having minimized variations in a contact resistance and a value of leakage current.

68 Claims, 6 Drawing Sheets

FOREIGN PATENT DOCUMENTS

| | | |
|---|---|---|
| JP | 09-289247 | 11/1997 |
| JP | 9-289247 | 11/1997 |
| JP | 10-163205 | 6/1998 |
| JP | 10-326829 | 12/1998 |
| JP | 11-186520 | 7/1999 |
| JP | 11-204520 | 7/1999 |
| JP | 11-512877 | 11/1999 |
| JP | 2000-31086 | 1/2000 |
| JP | 2000-058531 | 2/2000 |
| JP | 2001-015596 | 1/2001 |
| JP | 2001-189306 | 7/2001 |

OTHER PUBLICATIONS

English language reference EP 0 967 640 corresponding to JP 11-512877.

English Abstract of U.S. Patent No. 6,162,677 corresponding to JP 11-186520.

* cited by examiner

CONTACT HOLE FORMATION METHOD

BACKGROUND OF THE INVENTION

1. Field of the Invention

The present invention relates to a contact hole formation method. More particularly, the present invention relates to a method for forming contact holes in an area in which gate electrodes are densely formed and an area in which gate electrodes are sparsely formed.

2. Description of the Background Art

In recent years, a width of a gate electrode and a pitch between the gate electrodes has become increasingly narrow with the achievement of a high degree of integration of a semiconductor device. Specifically, if a process rule is equal to or smaller than 0.18 µm, the minimum space between adjacent gate electrodes is approximately 0.3 µm, which is extremely narrow. As a result, in the case where the above-described narrow space between the adjacent gate electrodes is filled with an interlayer dielectric, there arises a problem of void formation in the interlayer dielectric between the adjacent gate electrodes.

Therefore, heat treatment is performed for the interlayer dielectric in order to eliminate voids formed between the adjacent gate electrodes. The heat treatment is a process performed for reflowing the interlayer dielectric by heating the interlayer dielectric. The above-described process allows the voids formed between the adjacent gate electrodes to be eliminated.

As a material of the interlayer dielectric for which the above-described heat treatment is performed, it is preferable to use a material which is softened at a low temperature. Because the material softens at a low temperature, transistor characteristics are prevented from being impaired by exposure to an elevated temperature during the heat treatment. For that reason, a boron phosphorous silicate glass (BPSG) film, which reflows at approximately 800 degrees centigrade, is used as the interlayer dielectric. Note that the BPSG film is a dielectric film made out of a silicon oxide film doped with boron (B) and phosphorus (P).

Hereinafter, referring to the drawings, a conventional method for forming contact holes in a semiconductor device using the above-described BPSG film as an interlayer dielectric is described. FIGS. 5A to 5D are cross section views of a semiconductor device in the process of opening contact holes. Before contact holes are opened through the semiconductor device, transistors are formed on a silicon substrate, and an interlayer dielectric is further formed thereon. Note that a cross section view shown in FIG. 5 illustrates a portion of the semiconductor device which functions as a switching device used in a memory, etc.

Figure 5A:
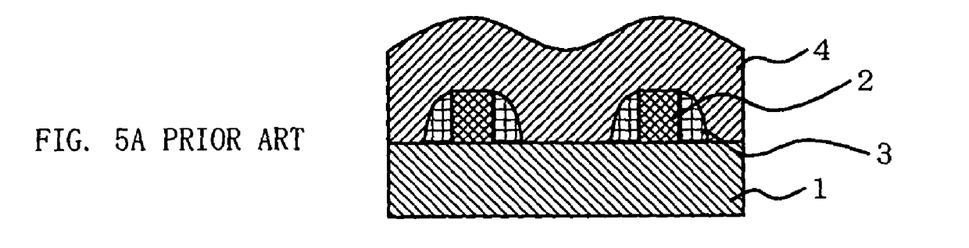
FIGS. 5A to 5D are cross section views of a semiconductor device processed in accordance with a conventional contact hole formation method.

First, MOS field effect transistors are formed on a silicon substrate 1. Specifically, a gate oxide film (not shown) is formed, and gate electrodes 2 (for example, a polysilicon film) are formed on the gate oxide film. A source region (not shown) and a drain region (not shown) are formed after formation of a gate oxide film (not shown), gate electrodes 2 (for example, a polysilicon film), and side walls 3 (for example, a TEOS film).

Next, a BPSG film 4 is deposited on the gate electrode 2 as an interlayer dielectric. Then, heat treatment is performed for the BPSG film 4 in order to reflow the BPSG film 4. Thus, voids formed between the adjacent gate electrodes 2 are eliminated to the outside of the BPSG film 4. A cross section view of the semiconductor device after the above-described process is shown in FIG. 5A. After completion of the heat treatment, a non-doped oxide film 5 such as a TEOS film, for example, is deposited on the BPSG film 4.

Here, the non-doped oxide film 5 is deposited on the BPSG film 4 for the following reason. The BPSG film 4 is highly hygroscopic. Specifically, when the BPSG film 4 is exposed to the air, boron or phosphorus contained in the BPSG film 4 reacts with water in the air. As a result, compounds of boron, phosphorus, and oxygen, such as $BPO_4$, $B_2O_3$, and $PO_4$, for example, are formed and precipitated on the BPSG film 4. The above-described compounds are foreign substances on the BPSG film 4, and substantially reduce yield in the subsequent semiconductor device manufacturing process. Thus, the non-doped oxide film 5, which functions as a protective coat, is deposited on the BPSG film 4 so as to prevent the BPSG film 4 from being exposed to the air.

Figure 5B:
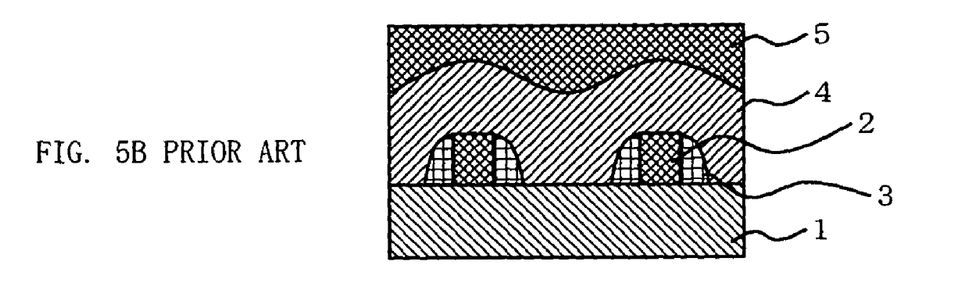

After deposition of the non-doped oxide film 5 is completed, a surface of the non-doped oxide film 5 is planarized by means of chemical-mechanical polishing (CMP) as shown in FIG. 5B. The above-described planarization is performed so that a photoresist can be accurately formed on the non-doped oxide film in the following process.

Figure 5C:
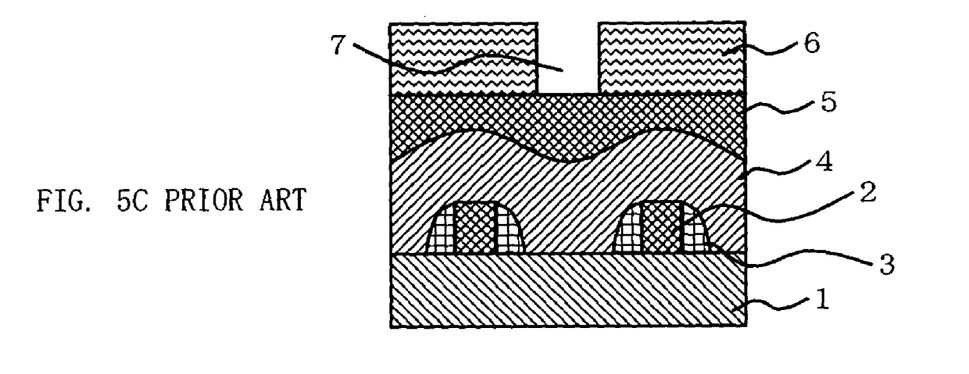

Next, a photoresist 6 having an opening 7 is formed on the planarized non-doped oxide film 5 by photolithography. FIG. 5C illustrates the cross section view of the semiconductor device after the above-described process.

Figure 5D:
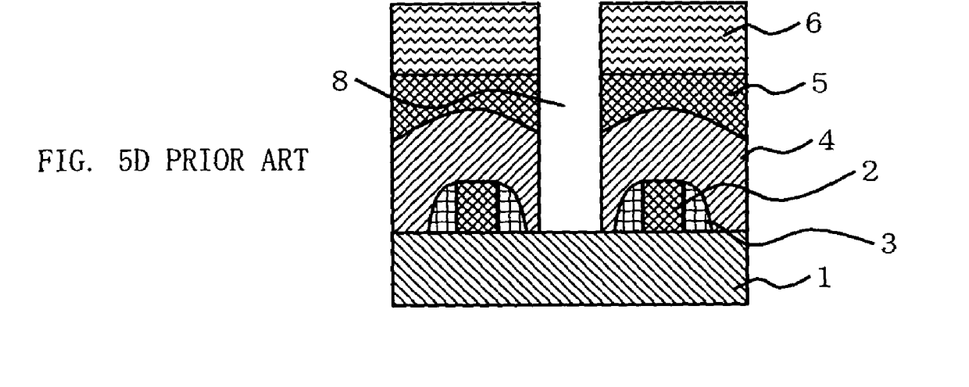

Next, as shown in FIG. 5D, dry etching is performed for the non-doped oxide film 5 and the BPSG film 4 using the photoresist 6 as a protective mask for opening a contact hole 8. After the above-described dry etching, the contact hole 8 is filled with metal (for example, tungsten), thereby completing formation of a contact connecting the transistor in the silicon substrate 1 and an interconnection (not shown) formed in an upper layer.

Figure 6:
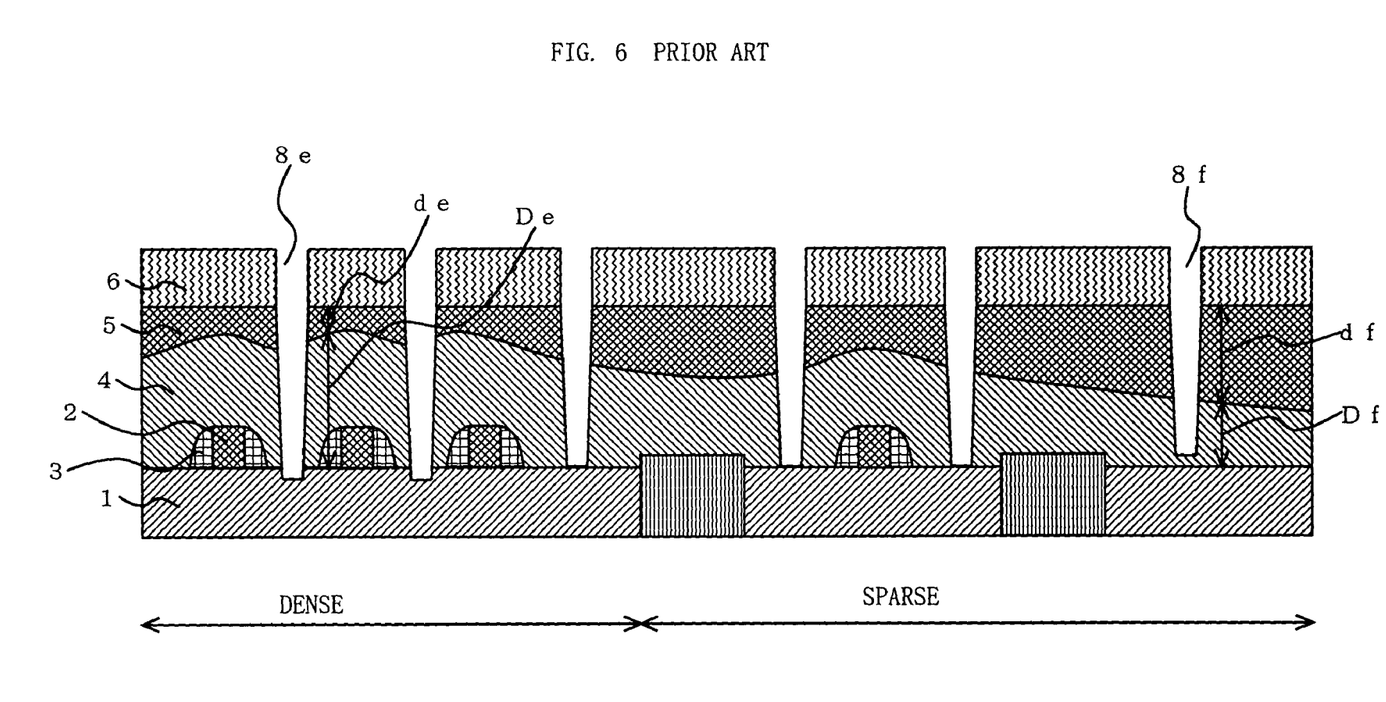
FIG. 6 is a cross section view of a semiconductor device after contact holes are formed in accordance with the conventional contact hole formation method.

Note that the gate electrodes 2 of the respective transistors are not formed at regular intervals on the silicon substrate 1. As a result, on the silicon substrate 1, gate electrodes 2 are densely formed in some areas and sparsely formed in other areas. The above-described two types of areas, that is, an area in which the gate electrodes 2 are densely formed and an area in which the gate electrodes 2 are sparsely formed, will cause the following problem, which will be described in a concrete manner with reference to the drawings. FIG. 6 is a cross section view of a semiconductor device having an area in which the gate electrodes 2 are densely formed and an area in which the gate electrodes 2 are sparsely formed.

First, as described in FIG. 5A, the BPSG film 4 is formed on the silicon substrate 1 and reflowed by the heat treatment, whereby the voids in the BPSG film 4 are eliminated and the surface of the BPSG film 4 is planarized.

However, if the gate electrodes 2 are densely formed in some areas and sparsely formed in other areas, the surface of the BPSG film 4 becomes uneven, as shown in FIG 6, because density of the gate electrodes 2 varies from area to area even after the above-described heat treatment is performed. Specifically, in the area in which the gate electrodes 2 are densely formed, a film thickness De of the BPSG film 4 becomes thick. On the other hand, in the area in which the gate electrodes 2 are sparsely formed, a film thickness Df of the BPSG film 4 becomes thin. As described above, the heat treatment allows the surface of the BPSG film 4 to be planarized in terms of a local area, such as an area in which the gate electrodes 2 are densely formed or an area in which the gate electrodes 2 are sparsely formed. In terms of the entire area of the semiconductor device, however, the surface of the BPSG film 4 is not planarized. If the non-doped oxide film 5 is deposited on the above-described BPSG film 4 whose surface is not evenly planarized, and the surface of the non-doped oxide film 5 is planarized by means of CMP, a layer composed of the BPSG film 4 and the non-doped oxide film 5 is uniform in thickness, but a thickness ratio of the BPSG film 4 to the non-doped oxide film 5 varies from area to area.

The above-described variations in the thickness ratio cause the following problem at the time of opening of the contact holes. Specifically, the contact holes are opened by removing the BPSG film 4 and the non-doped oxide film 5 by means of dry etching using CxFy gas (for example, $C_4F_8$, $C_5F_8$, $C_4F_6$). Here, an etching rate of the BPSG film 4 is higher than that of the non-doped oxide film 5. As a result, if a thickness ratio of the BPSG film 4 to the non-doped oxide film 5 varies from area to area on the semiconductor device, an etching rate of the interlayer dielectric (that is, a layer composed of the BPSG film 4 and the non-doped oxide film 5) varies from area to area on the semiconductor device. Due to the above-described variations in the etching rate, the opened contact holes vary in depth from area to area on the semiconductor device.

With reference to FIG. 6, a comparison between a depth of a contact hole 8e opened in an area in which the gate electrodes 2 are densely formed and a depth of a contact hole 8f opened in an area in which the gate electrodes 2 are sparsely formed will be described below in a concrete manner. Note that film thicknesses of the BPSG film 4 and the non-doped oxide film 5 are assumed to be De and de, respectively, in an area in which the gate electrodes 2 are densely formed. On the other hand, film thicknesses of the BPSG film 4 and the non-doped oxide film 5 are assumed to be Df and df, respectively, in an area in which the gate electrodes 2 are sparsely formed. Also, note that there are relationships De>Df and de>df among the above-described four film thicknesses.

As shown in FIG. 6, in the area in which the gate electrodes 2 are densely formed, a film of the non-doped oxide film 5 (whose etching rate is relatively higher than that of the BPSG film 4) is thicker, and a film of the BPSG film 4 (whose etching rate is relatively lower than that of the non-doped oxide film 5) is thinner, compared to the area in which the gate electrodes 2 are sparsely formed. As a result, in the area in which the gate electrodes 2 are densely formed, an etching rate of the interlayer dielectric is higher, compared to the area in which the gate electrodes 2 are sparsely formed. Due to the above-described higher etching rate, the bottom of the contact hole 8e reaches the silicon substrate 1 before the bottom of the contact hole 8f reaches the silicon substrate 1, in the case where the contact hole 8e and the contact hole 8f are concurrently formed. As a result, the silicon substrate 1 is also etched in the area in which the gate electrodes 2 are densely formed. If the silicon substrate 1 is also etched as described above, a leakage current occurs, which results in a malfunction of the semiconductor device. On the other hand, in the area in which the gate electrodes 2 are sparsely formed, there is a likelihood that the bottom of the contact hole will not reach the silicon substrate 1, which results in high incidence of breaks within the semiconductor device.

Moreover, the variations in depth of the contact hole, which tapers gently down from an opening to the bottom, results in variations in the area of the bottom of the contact hole, thereby increasing variations in contact resistance.

Note that, in the above descriptions, the silicon substrate 1 having an area in which the gate electrodes 2 are densely formed and an area in which the gate electrodes 2 are sparsely formed has been described. However, the same problem will arise in the case where interconnections are formed on the silicon substrate 1. Specifically, in an area in which a distance between interconnections is narrow, deep contact holes are formed, as in the case of the area in which the gate electrodes 2 are densely formed. On the other hand, in an area in which a distance between interconnections is wide, shallow contact holes are formed, as in the case of the area in which the gate electrodes 2 are sparsely formed. Furthermore, a width of the interconnection as well as the distance between the interconnections also affects the depth of the contact hole. Specifically, in an area in which wide interconnections are formed, deep contact holes are formed, as in the case of the area in which the gate electrodes 2 are densely formed. On the other hand, in an area in which narrow interconnections are formed, shallow contact holes are formed, as in the case of the area in which the gate electrodes 2 are sparsely formed.

SUMMARY OF THE INVENTION

Therefore, an object of the present invention is to provide a method for forming contact holes of uniform depth through a dielectric layer composed of two types of dielectric films having different etching rates, even if transistors are densely formed in some areas and sparsely formed in other areas, or a distance between interconnections is narrow in some areas and wide in other areas, and even if a width of the interconnection varies from area to area on the semiconductor device.

The present invention has the following features to attain the object mentioned above.

In the present aspect, after deposition of a first dielectric film on a semiconductor substrate having an area in which gate electrodes are densely formed and an area in which gate electrodes are sparsely formed, the first dielectric film is planarized. On the planarized first dielectric film, a second dielectric film whose etching rate is different from an etching rate of the first dielectric film is deposited, and contact holes are formed through the first and second dielectric films. If the first dielectric film is deposited on the semiconductor substrate having variations in the distribution of the gate electrodes, a film thickness of the first dielectric film becomes nonuniform due to the variations in the distribution of the gate electrodes. If the second dielectric film, whose etching rate is different from an etching rate of the first dielectric film, is deposited on the first dielectric film having a nonuniform film thickness, there arises a problem that an etching rate of a dielectric layer composed of the first and second dielectric films varies from area to area on the semiconductor device. As a result, it is difficult to form the contact holes of uniform depth over the entire area of the semiconductor device. Therefore, in the present aspect, thicknesses of the first and second dielectric films are made uniform over the entire area of the semiconductor device by planarizing the first dielectric film, thereby obtaining a uniform etching rate of the dielectric layer composed of the first and second dielectric films over the entire area of the semiconductor device. As a result, it is possible to form the contact holes of uniform depth.

The second dielectric film is deposited on the planarized first dielectric film, whereby it is possible to deposit the second dielectric film so as to have a uniform thickness. In order to further improve uniformity of the film thickness of the second dielectric film, the surface of the second dielectric film may be planarized.

As the above-described first dielectric film, a BPSG film, for example, is used. The BPSG film is reflowed at approximately 800 degrees centigrade, which is a relatively low temperature. Thus, it is possible to prevent a transistor from being damaged due to a high temperature when eliminating voids formed in the dielectric film by heat treatment.

After planarization of the first dielectric film, the second dielectric film is preferably deposited thereon before formation of a precipitate on the surface of the first dielectric film because the above-described precipitate will interfere with the uniform deposition of the second dielectric film. Specifically, the second dielectric film is preferably deposited within 24 hours after planarization of the first dielectric film.

If a precipitate is formed on the surface of the first dielectric film before deposition of the second dielectric film, the above-described precipitate may be eliminated. After elimination of the above-described precipitate, it is possible to deposit the second dielectric film of uniform thickness.

Also, the contact holes may be formed so as to reach the semiconductor substrate, or formed so as to reach the respective gate electrodes.

Furthermore, it is possible to apply the present aspect to a case in which the contact holes are formed in a semiconductor device having an area in which interconnections are densely formed and an area in which interconnections are sparsely formed, or a case in which the contact holes are formed in a semiconductor device on which a plurality of interconnections of different widths are formed.

Note that the present aspect is directed to a contact hole formation method, but also directed to a semiconductor device fabricated using the above-described contact hole formation method.

These and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter, referring to the drawings, a contact hole formation method according to a first embodiment of the present invention will be described. According to the contact hole formation method of the present embodiment, contact holes are opened in a semiconductor device having a silicon substrate on which an interlayer dielectric film composed of a BPSG film layer and a non-doped oxide film layer is deposited. A main feature of the contact hole formation method of the present embodiment is that the BPSG film and the non-doped oxide film, which are deposited on the silicon substrate, are planarized, whereby contact holes of uniform depth can be opened even if the semiconductor device has an area in which gate electrodes of a transistor are densely formed and an area in which gate electrodes are sparsely formed. Here, FIGS. 1A to 1E are cross section views of a semiconductor device in the process of having contact holes opened therein. The semiconductor device shown in FIG. 1 includes the silicon substrate, and transistors formed thereon, and an interlayer dielectric further formed thereon. Note that a cross section views shown in FIG. 1 illustrates a portion of the semiconductor device which functions as a switching device used for a memory, etc.

Figure 1A:
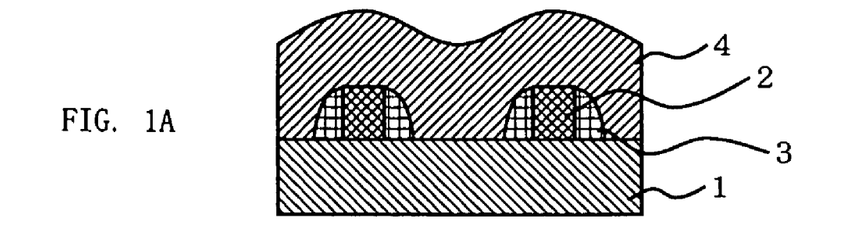
FIGS. 1A to 1E are cross section views of a semiconductor device in a process described in a first embodiment of the present invention.

First, MOS field effect transistors are formed on the silicon substrate 1. Specifically, the gate oxide film (not shown) and the gate electrodes 2 (for example, a polysilicon film whose film thickness is approximately 200 nm) are formed. Next, the TEOS film, whose film thickness is approximately 200 nm, is deposited, and the side walls 3 are formed by performing an etch back process for the TEOS film. Then, the source region (not shown) and the drain region (not shown) are formed.

Next, on the silicon substrate 1 on which the transistors are formed, the BPSG film 4 functioning as an interlayer dielectric is deposited by means of chemical-vapor deposition (CVD). Note that the BPSG film 4 has a thickness of approximately 1000 nm, and contains about 3.0 wt % of boron (B) and about 5.0 wt % of phosphorus (P).

Then, heat treatment is performed for reflowing the BPSG film 4, thereby eliminating voids formed between the adjacent gate electrodes 2 to the outside of the BPSG film 4. Note that the heat treatment is performed, for example, by heating the semiconductor device at approximately 800 degrees centigrade for about 30 minutes. FIG. 1A illustrates the cross section of the semiconductor device after performing the above-described heat treatment.

Figure 1B:
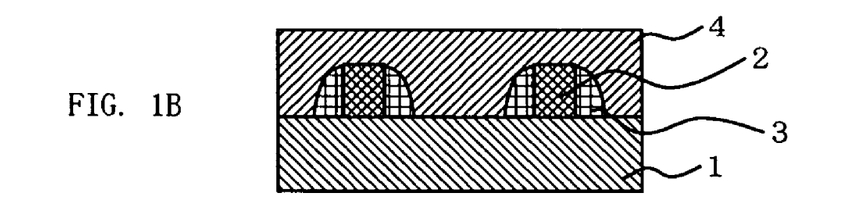

Next, as shown in FIG. 1B, the surface of the BPSG film 4 is planarized by means of CMP. For performing the above-described CMP, various conditions such as processing time, etc., are adjusted so that a film thickness of the planarized BPSG film 4 becomes approximately 600 nm. The CMP allows the BPSG film 4 to have a uniform thickness, irrespective of whether or not there is a gate electrode 2 on the silicon substrate 1, by global planarization of the surface of the BPSG film 4. Note that the above-described process is a main feature of the present invention.

Figure 1C:
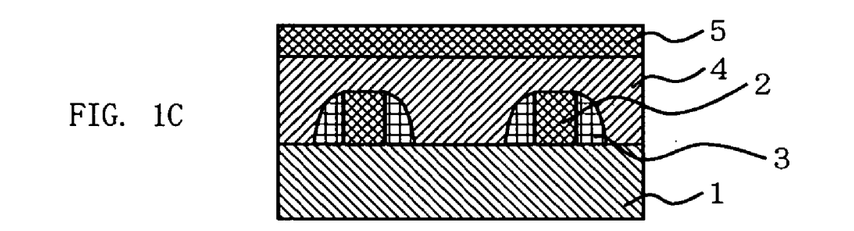

Next, as shown in FIG. 1C, the non-doped oxide film 5 is deposited on the surface of the BPSG film 4, which has been planarized by means of CMP. Specifically, the TEOS film, whose film thickness is approximately 50 nm, is deposited by means of CVD. Here, when the surface of the BPSG film 4 is exposed to the air, boron or phosphorus contained in the BPSG film 4 reacts with water in the air. As a result, compounds such as $BPO_4$, $B_2O_3$, and $PO_4$, for example, are formed and precipitated on the surface of the BPSG film 4. The above-described compounds are foreign substances on the surface of the BPSG film 4, and substantially reduce yield in the subsequent semiconductor device manufacturing process. Thus, the non-doped oxide film 5, which functions as a protective coat, is deposited on the BPSG film 4.

Figure 2:
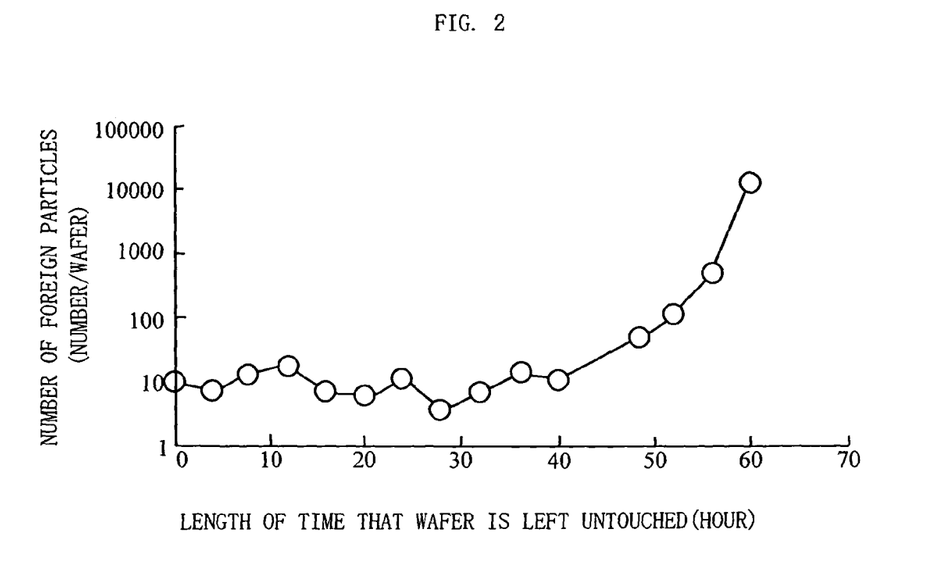
FIG. 2 is a line graph showing a relationship between the length of time that a wafer is left untouched and the number of foreign substances.

As described above, when the surface of the BPSG film 4 is exposed to the air, compounds such as $BPO_4$, $B_2O_3$, and $PO_4$, for example, are precipitated on the surface of the BPSG film 4 as foreign substances. Thus, it is necessary to deposit the non-doped oxide film 5 immediately after the BPSG film 4 is planarized by means of CMP. Hereinafter, with reference to the drawing, a time limit to deposit the non-doped oxide film 5 after planarization of the surface of the BPSG film 4 will be described. FIG. 2 is a line graph showing a relationship between the length of time that an 8-inch wafer is left untouched and the number of foreign substances when the wafer is left untouched in a clean room generally used for manufacturing the semiconductor device. Specifically, the horizontal axis of the graph indicates the length of time that the wafer is left untouched after planarization of the BPSG film 4, and the vertical axis indicates the number of foreign substances per wafer.

As shown in FIG. 2, the number of foreign substances is sharply increased after a lapse of 48 hours after planarization of the BPSG film 4. Thus, in this embodiment, allowing for a margin of a certain amount of time, the non-doped oxide film 5 (for example, a TEOS film) is deposited within about 24 hours after planarization of the BPSG film 4 by means of CMP. As a result, it is possible to prevent the formation of foreign substances on the planarized BPSG film 4, and to deposit the non-doped oxide film 5 so as to be more uniform than before.

Figure 1D:
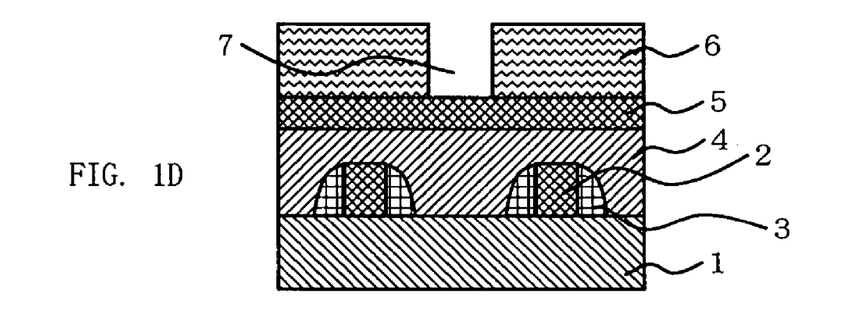

After deposition of the non-doped oxide film 5, the photoresist 6 having an opening 7 in a predetermined area as shown in FIG. 1D is formed on the non-doped oxide film 5 by photolithography.

Figure 1E:
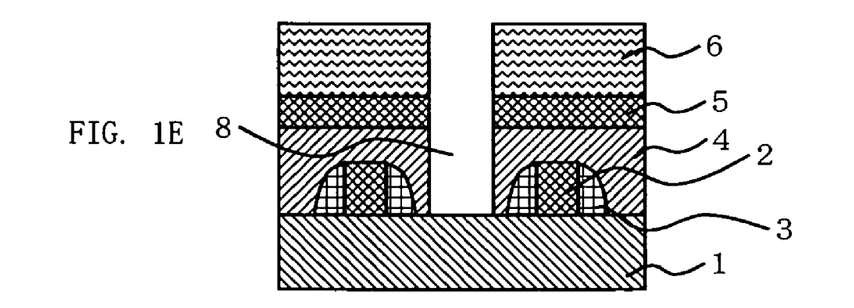

Next, as shown in FIG. 1E, dry etching is performed using the photoresist 6 as a protective mask for opening a contact hole 8 penetrating through the BPSG film 4 and the non-doped oxide film 5 and reaching the silicon substrate 1. For the above-described dry etching, CxFy gas (for example, $C_4F_8$, $C_5F_8$, $C_4F_6$) is used.

Then, ashing, etc., is performed for removing the photoresist 6, and the contact hole 8 is filled with metal (for example, tungsten). Specifically, the contact hole 8 is filled with metal by means of CVD or plating, etc., and the excess metal is removed by means of CMP, thereby completing formation of a contact electrically connecting an interconnection (not shown) formed in an upper layer and the transistor, etc., on the silicon substrate 1.

Figure 3:
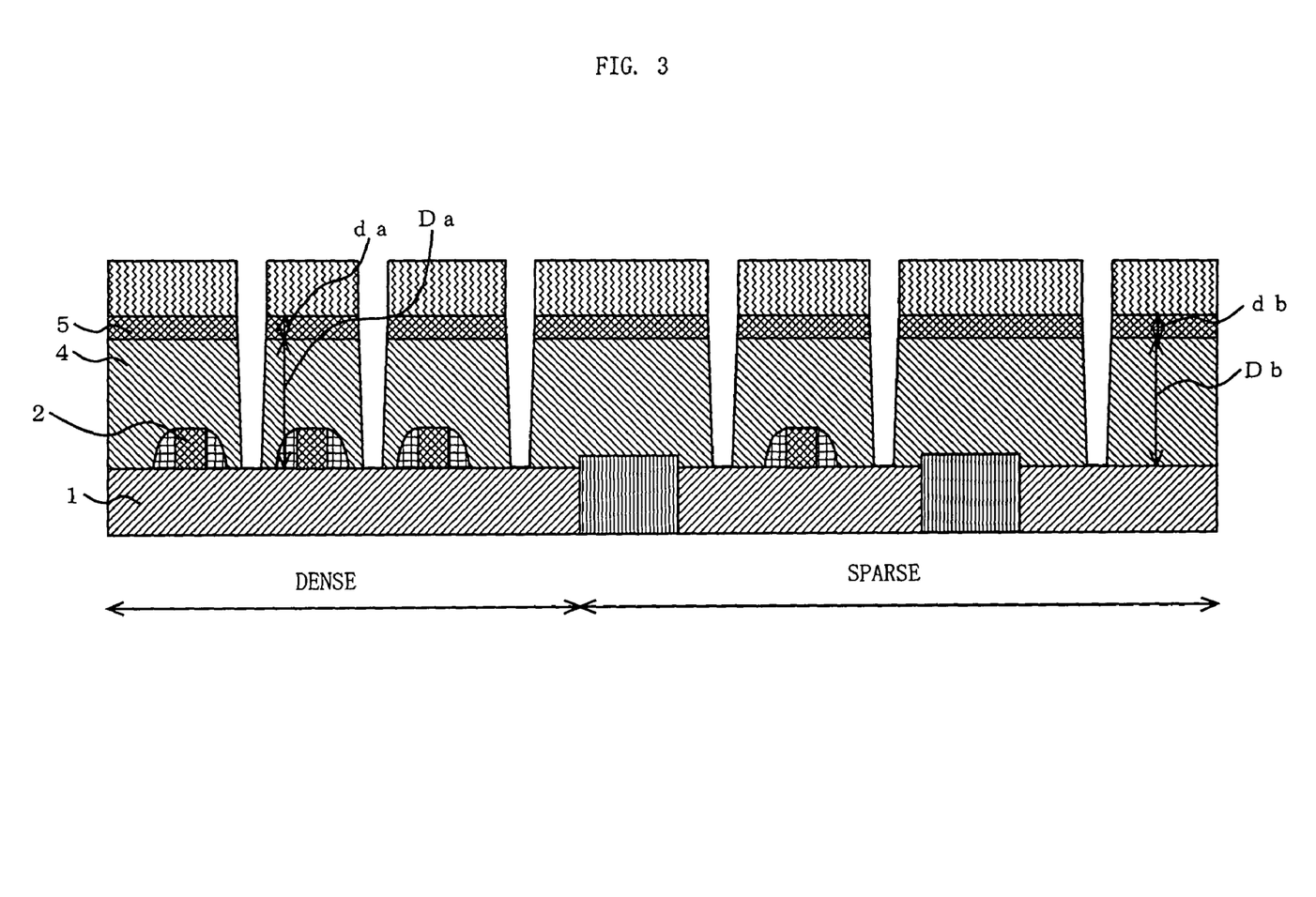
FIG. 3 is a cross section view of a semiconductor device after contact holes are formed in accordance with a contact hole formation method of the present invention.

Here, the effects obtained from planarization of the BPSG film 4 will be described with reference to the drawing. Note that the planarization of the BPSG film 4 is a main feature of the contact hole formation method according to the present embodiment. FIG. 3 is a cross section view of a semiconductor device after contact holes are formed through the interlayer dielectric in accordance with a contact hole formation method of the present embodiment.

As aforementioned, in the present embodiment, the non-doped oxide film 5 is deposited on the planarized BPSG film 4, and the non-doped oxide film 5 is also planarized. Thus, it is possible to form the BPSG film 4 and the non-doped oxide film 5 each having a uniform thickness over the entire area of the semiconductor device as shown in FIG. 3, irrespective of whether the gate electrodes 2 formed on the silicon substrate 1 are densely or sparsely distributed. Specifically, a film thickness Da of the BPSG film 4 in an area in which the gate electrodes 2 are densely formed is equal to a film thickness Db of the BPSG film 4 in an area in which the gate electrodes 2 are sparsely formed, and a film thickness da of the non-doped oxide film 5 in the area in which the gate electrodes 2 are densely formed is equal to a film thickness db of the non-doped oxide film 5 in the area in which the gate electrodes 2 are sparsely formed. Thus, it is possible to equalize an etching rate of the interlayer dielectric (in this embodiment, a dielectric layer composed of the BPSG film 4 and the non-doped oxide film 5) over the entire area of the semiconductor device. As a result, it is possible to open a plurality of contact holes of uniform depth in the entire area of a dielectric film by means of dry etching. The above-described dielectric film is composed of more than 1 type of dielectric film each having different etching rates, and deposited on the silicon substrate 1 having an area in which the gate electrodes 2 are densely formed and an area in which the gate electrodes 2 are sparsely formed. Thus, the contact hole formation method according to the present embodiment can prevent the following adverse phenomenon, for example, a phenomenon in which leakage of current occurs because the substrate is also etched due to an increased etching rate in an area in which the gate electrodes 2 are densely formed, or a phenomenon in which an interconnection between the semiconductor device and its lower layer tends to be broken because the bottom of the contact hole does not reach the substrate due to a reduced etching rate in an area in which the gate electrodes 2 are sparsely formed.

Also, a uniform etching rate allows the contact holes of the same depth to be opened in the semiconductor device in the same etching time, thereby reducing variations in the area of the bottom of the contact hole and minimizing variations in contact resistance. As a result, it is possible to form the contact holes of uniform depth over the entire area of the semiconductor device irrespective of whether the gate electrodes 2 are densely or sparsely distributed.

(Second Embodiment)

A contact hole formation method according to a second embodiment differs from the contact hole formation method according to the first embodiment in that a cleaning process is additionally included. Specifically, in the present embodiment, after planarization of the surface of the BPSG film 4 (see FIG. 1B), the surface of the BPSG film 4 is cleaned with a chemical solution such as acid, for example, before deposition of the non-doped oxide film 5 (see FIG. 1C). Note that processes of the second embodiment are identical to those described in the first embodiment except for the above-described cleaning process. Hereinafter, a contact hole formation method according to the second embodiment will be described with reference to the drawing.

First, MOS field effect transistors are formed on the silicon substrate 1. Specifically, the gate oxide film (not shown) and the gate electrodes 2 (for example, a polysilicon film whose film thickness is approximately 200 nm) are formed. Next, the TEOS film, whose film thickness is approximately 200 nm, is deposited, and the side walls 3 are formed by performing an etch back process for the TEOS film. Then, the source region (not shown) and the drain region (not shown) are formed.

Next, on the silicon substrate 1 on which the transistors are formed, the BPSG film 4 functioning as an interlayer dielectric is deposited by means of chemical-vapor deposition (CVD). Note that the BPSG film 4 has a thickness of approximately 1000 nm, and contains about 3.0 wt % of boron (B) and about 5.0 wt % of phosphorus (P).

Then, heat treatment is performed for reflowing the BPSG film 4, thereby eliminating voids formed between the adjacent gate electrodes 2 to the outside of the BPSG film 4. Note that the above-described heat treatment is performed, for example, by heating the semiconductor device at approximately 800 degrees centigrade for about 30 minutes. FIG. 1A illustrates the cross section of the semiconductor device after the above-described heat treatment is performed. Note that the processes as described above are identical to those of the first embodiment.

Next, as shown in FIG. 1B, the surface of the BPSG film 4 is planarized by means of CMP. For performing the above-described CMP, various conditions such as processing time, etc., are adjusted so that a film thickness of the planarized BPSG film 4 becomes approximately 600 nm. The CMP allows the BPSG film 4 to have a uniform thickness, irrespective of whether or not there is the gate electrode 2, by global planarization of the surface of the BPSG film 4. Note that the above-described process is also identical to that of the first embodiment.

After completion of CMP, the surface of the BPSG film 4 is cleaned with the chemical solution such as acid, for example, for eliminating impurities. Specifically, the semiconductor device is immersed in sulfuric acid at approximately 110 degrees centigrade for cleaning the surface of the BPSG film 4. Then, sulfuric acid coating the semiconductor device is washed off with water, and the semiconductor device is dried.

Here, the above-described cleaning process is described in detail. As shown in FIG. 2, after planarization of the surface of the BPSG film 4, if 24 hours or more have elapsed before the non-dopes oxide film 5 is deposited in the next process (FIG. 1C), boron (B) or phosphorus (P) contained in the BPSG film 4 may react with oxygen in the air to form and precipitate compounds such as $BPO_4$, $B_2O_3$, and $PO_4$, for example, in large quantity on the surface of the BPSG film 4. Therefore, if the above-described compounds are precipitated on the surface of the BPSG film 4 during a time period from planarization of the surface of the BPSG film 4 to deposition of the non-doped oxide film 5, the precipitated compounds have to be eliminated. Thus, in the present embodiment, the surface of the BPSG film 4 is cleaned with the chemical solution such as acid, etc., which dissolves the compounds such as $BPO_4$, $B_2O_3$, and $PO_4$, for example. Note that, as acid for dissolving the above-described compounds, hydrochloric acid, nitric acid, or hydrofluoric acid may be used other than sulfuric acid.

In the cleaning process of the present embodiment, only the precipitated compounds are dissolved. However, the BPSG film 4 is not dissolved in the same cleaning process. Thus, even if the surface of the BPSG film 4 is repeatedly cleaned, it is possible to eliminate only the compounds (that is, impurities) without reducing the thickness of the BPSG film 4. As a result, even if the compounds are precipitated again on the once-cleaned surface of the BPSG film 4 due to long hours elapsed before the non-doped oxide film 5 is deposited in the next process, it is possible to clean the surface of the BPSG film 4 again without regard to reduction of the thickness of the BPSG film 4, thereby improving yield of a semiconductor substrate.

After completion of cleaning of the surface of the BPSG film 4, the non-doped oxide film 5 is deposited on the surface of the BPSG film 4 as shown in FIG. 1C. Specifically, the TEOS film, whose film thickness is approximately 50 nm, is deposited by means of CVD. Here, when the surface of the BPSG film 4 is exposed to the air, boron or phosphorus contained in the BPSG film 4 reacts with water in the air. As a result, the compounds such as $BPO_4$, $B_2O_3$, and $PO_4$, for example, are formed and precipitated on the surface of the BPSG film 4. The above-described compounds are foreign substances on the surface of the BPSG film 4, and substantially reduce yield in the subsequent semiconductor device manufacturing process. Thus, the non-doped oxide film 5, which functions as a protective coat, is deposited on the BPSG film 4. Note that the above-described process is also identical to that of the first embodiment.

After deposition of the non-doped oxide film 5, the photoresist 6 having an opening 7 in a predetermined area as shown in FIG. 1D is formed on the non-doped oxide film 5 by photolithography. Note that the above-described process is also identical to that of the first embodiment.

Next, as shown in FIG. 1E, dry etching is performed using the photoresist 6 as a protective mask for opening a contact hole 8 penetrating through the BPSG film 4 and the non-doped oxide film 5 and reaching the silicon substrate 1. For the above-described dry etching, CxFy gas (for example, $C_4F_8$, $C_5F_8$, $C_4F_6$) is used. Note that the above-described process is also identical to that of the first embodiment.

Then, ashing, etc., is performed for removing the photoresist 6, and the contact hole 8 is filled with metal (for example, tungsten). Specifically, the contact hole 8 is filled with metal by means of CVD or plating, etc., and the excess metal is removed by means of CMP, thereby completing formation of a contact electrically connecting an interconnection (not shown) formed in an upper layer and the transistor, etc., on the silicon substrate 1.

As described above, according to the contact hole formation method of the present embodiment, even if compounds are precipitated on the surface of the BPSG film 4 after a predetermined time period (for example, 24 hours or more) has elapsed after planarization of the BPSG film 4, it is possible to eliminate the compounds precipitated on the surface of the BPSG film 4. As a result, the non-doped oxide film 5 can be uniformly deposited. That is, it is not necessary to control the time elapsed after planarization of the BPSG film 4 because foreign substances on the surface of the BPSG film 4 are reliably eliminated. Thus, even if the wafer is left untouched after deposition of the BPSG film 4 for a predetermined time period, and compounds are precipitated on the surface of the BPSG film 4 during the predetermined time period before deposition of the non-doped oxide film 5, it is possible to form contact holes of uniform depth, thereby preventing yield from being reduced in the subsequent semiconductor device manufacturing process.

Note that the non-doped oxide film 5 in the first and second embodiments may be a film other than the TEOS film as long as the film is a dielectric film containing no impurities such as boron (B) and phosphorus (P), or a dielectric film whose impurity concentration is extremely low. For example, a silicon nitride film may be used as the above-described dielectric film.

Also, the interlayer dielectric deposited on the silicon substrate 1 in the first and second embodiments is not limited to the BPSG film 4, and a film whose surface shows pits and projections of the transistor, etc., formed on the silicon substrate 1 may be used as the interlayer dielectric. For example, an oxide film formed by coating, a low dielectric constant film, a PSG film which is a film made out of a silicon oxide film doped with phosphorus, or a BSG film which is a film made out of a silicon oxide film doped with boron may be used as the above-described interlayer dielectric. Note that the above-described low dielectric constant film may be a SiOC film, an organic film, or a porous film, for example.

Also, in the first and second embodiments, the BPSG film 4 is planarized by means of CMP, but the BPSG film 4 maybe planarized by an etch back process in place of CMP. Specifically, the surface of the BPSG film 4 to be planarized is evenly coated with a resist having the same etching rate as the BPSG film 4. Then, dry etching is performed for the resist and the surface of the BPSG film 4 using the above-described resist as a sacrificial film. Thus, the resist is completely removed, and a portion of the BPSG film 4 is removed. Due to the same etching rate of the above-described resist and the BPSG film 4, the BPSG film 4 having an even surface can be obtained by the above-described etch back process. Note that the non-doped oxide film 5 can also be planarized by the above-described etch back process, as in the case of the BPSG film 4.

Figure 4:
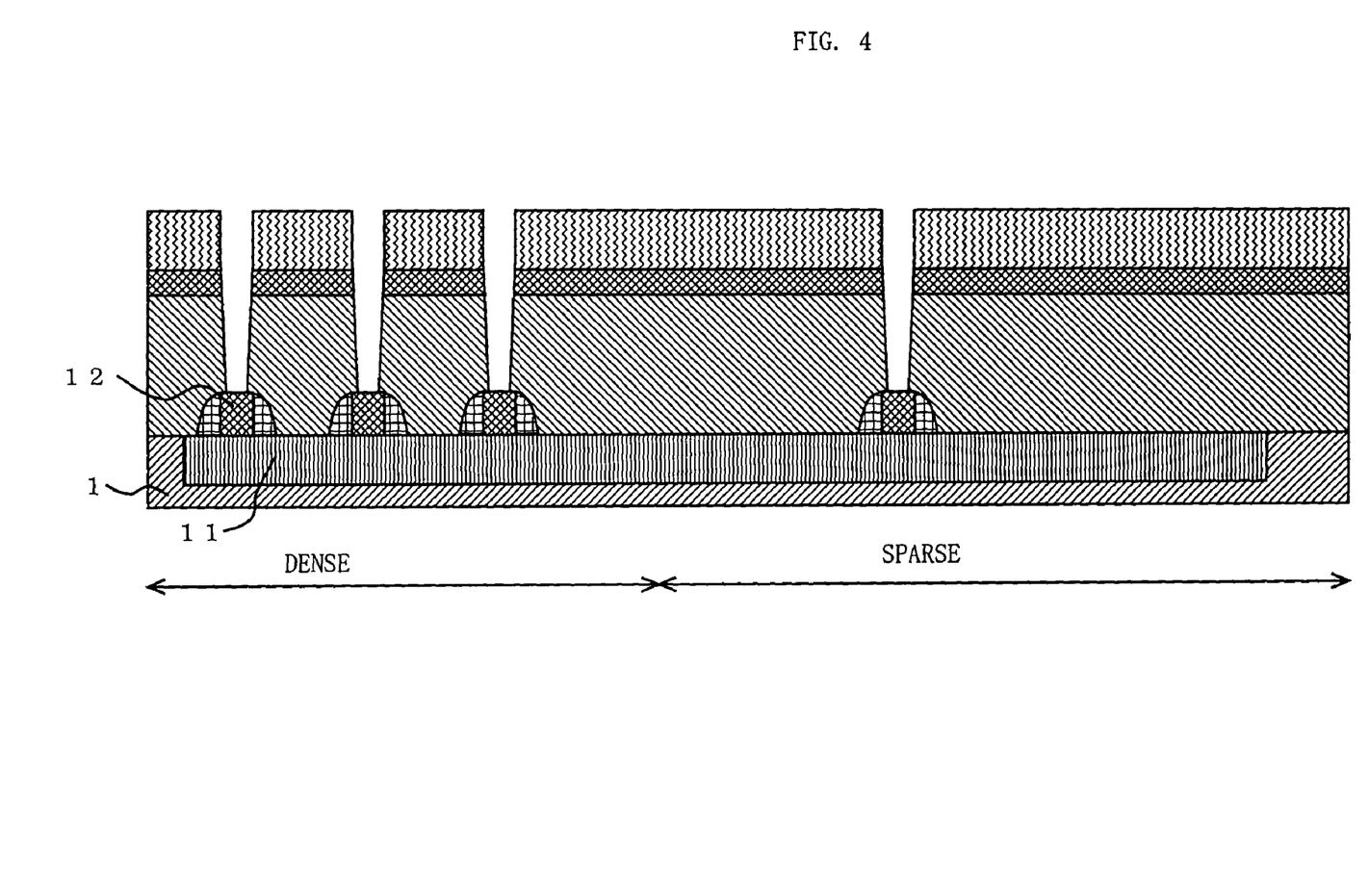
FIG. 4 is a cross section view of a semiconductor device after contact holes are formed on respective gate electrode interconnections in accordance with the contact hole formation method of the present invention.

Note that, in the first and second embodiments, the contact holes are opened between the gate electrodes of the transistor. However, the contact holes may be opened in other places. For example, the contact holes may be opened on the respective gate electrodes, or may be opened on respective gate electrode interconnections 12 as shown in FIG. 4. Here, the gate electrode interconnection 12 is an interconnection formed on an STI (Shallow Trench Isolation) dielectric film 11 on the silicon substrate 1, and the gate electrode interconnection 12 is connected to a gate electrode of the transistor. Also in this case, the gate electrode interconnections 12 are densely formed in some areas and sparsely formed in other areas, whereby there arises the same problem as the one which arises in the case of the gate electrode 2. However, the contact hole formation method according to the present invention allows the contact holes of uniform depth to be opened on the respective gate electrode interconnections 12, as is the case with the gate electrode 2.

While the invention has been described in detail, the foregoing description is in all aspects illustrative and not restrictive. It is understood that numerous other modifications and variations can be devised without departing from the scope of the invention.

What is claimed is:

1. A method for forming a semiconductor device comprising:
    forming a first group of gate electrodes on a first region of a substrate so that the first group of gate electrodes are densely arranged;
    forming a second group of gate electrodes on a second region of the substrate so that the second group of gate electrodes are sparsely arranged;
    forming a first dielectric film as a single layer on the first region and the second region of the substrate on which the gate electrodes are formed so that the first dielectric film fills entire spaces between the gate electrodes;
    planarizing the first dielectric film;
    forming a second dielectric film on the first dielectric film, the second dielectric film having an etching rate different from an etching rate of the first dielectric film; and then
    forming contact holes to a uniform depth through the first dielectric film and the second dielectric film,
    wherein an entire surface of the first dielectric film is continuous and higher than a top surface of the gate electrodes just prior to planarizing the first dielectric film, and
    wherein planarizing the first dielectric film results in the first dielectric film having a uniform thickness at those portions through which said contact holes are formed.

2. The method of claim 1, further comprising planarizing the second dielectric film before forming the contact.

3. The method of claim 1, wherein the first dielectric film includes phosphorus.

4. The method of claim 1, wherein the contact is connected to the substrate or a corresponding one of the gate electrodes.

5. The method of claim 1, wherein a distance between at least two adjacent ones of the gate electrodes formed on the first region is 0.3 µm or less.

6. The method of claim 1, further comprising heating the first dielectric film before the planarizing of the first dielectric film and after the forming of the first dielectric film.

7. The method of claim 1, wherein the second dielectric film is a non-doped oxide film.

8. The method of claim 1, wherein the first dielectric film is planarized by CMP.

9. The method of claim 1, wherein planarizing the first dielectric film results in the entire surface of the first dielectric film continuing to be higher than the top surface pf the gate electrodes.

10. The method of claim 1, wherein the first dielectric film is one selected from the group consisting of: a BPSG film, a PSG film, a BSG film, an oxide film which is formed by coating, a low dielectric constant film, an organic film, and a porous film.

11. The method of claim 1, wherein the second dielectric film is a TEOS film or a silicon nitride film.

12. The method of claim 1, wherein the etching rate of the first dielectric film is higher than the etching rate of the second dielectric film.

13. A method for forming a semiconductor device comprising:
    forming a first interconnection, a second interconnection adjacent the first interconnection, and a third interconnection adjacent the second interconnection, on a substrate;
    forming a first dielectric film as a single layer on the substrate so that the first dielectric film fills an entire space between the first and second interconnections and an entire space between the second and third interconnections;
    planarizing a surface of the first dielectric film;
    forming a second dielectric film on the surface of the first dielectric film, the second dielectric film having an etching rate different from an etching rate of the first dielectric film; and then
    forming contact holes to a uniform depth through the first dielectric film and the second dielectric film;
    wherein a distance between the first interconnection and the second interconnection is greater than a distance between the second interconnection and the third interconnection, and
    wherein an entire surface of the first dielectric film is continuous and higher than a top surface of the first, second and third interconnections just prior to planarizing the first dielectric film, and
    wherein planarizing the surface of the first dielectric film results in the first dielectric film having a uniform thickness at those portions through which said contact holes are formed.

14. The method of claim 13, wherein a distance between at least two adjacent ones of the interconnections formed on the first region is 0.3µm or less.

15. The method of claim 13, wherein the first dielectric film includes phosphorus.

16. The method of claim 13, wherein the second dielectric film is a non-doped oxide film.

17. the method of claim 13, wherein the first dielectric film is planarized by CMP.

18. The method of claim 13, wherein planarizing the first dielectric film results in the entire surface of the first dielectric film continuing to be higher than the top surface of the interconnections.

19. The method of claim 13, wherein the first dielectric film is one selected from the group consisting of: a BPSG film, a PSG film, a BSG film, an oxide film which is formed by coating, a low dielectric constant film, an organic film, and a porous film.

20. The method of claim 13, wherein the second dielectric film is a TEOS film or a silicon nitride film.

21. The method of claim 13, wherein the etching rate of the first dielectric film is higher than the etching rate of the second dielectric film.

22. A method for forming a semiconductor device comprising:
forming a plurality of interconnections on a substrate, the interconnections including first interconnections and a second interconnection, the first interconnections having a width different than a width of the second interconnection;
forming a first dielectric film on the substrate;
planarizing the first dielectric film;
forming a second dielectric film on the first dielectric film, the second dielectric film having an etching rate different from an etching rate of the first dielectric film; and then
forming contact holes to a uniform depth through the first dielectric film and the second dielectric film,
wherein an entire surface of the first dielectric film is continuous and higher than a top surface of the interconnections just prior to planarizing the first dielectric film, and
wherein planarizing the first dielectric film results in the first dielectric film having a uniform thickness at those portions through which said contact holes are formed.

23. The method of claim 22, wherein the first dielectric film includes phosphorus.

24. The method of claim 22, further comprisiong heating the first dielectric film before the planarizing the first dielectric film.

25. The method of claim 22, wherein the first dielectric film is planarized by CMP.

26. The method of claim 22, wherein planarizing the first dielectric film results in the entire surface of the first dielectric film continuing to be higher than the top surface of the interconnections.

27. The method of claim 22, wherein the first dielectric film is one selected from the group consisting of: a BPSG film, a PSG film, a BSG film, an oxide film which is formed by coating, a low dielectric constant film, an organic film, and a porous film.

28. The method of claim 22, wherein the second dielectric film is a TEOS film or a silicon nitride film.

29. The method of claim 22, wherein the etching rate of the first dielectric film is higher than the the etching rate of the second dielectric film.

30. A method for forming a semiconductor device comprising:
forming a first group of gate electrodes on a first region of a substrate so that the first group of gate electrodes are densely arranged;
forming a second group of gate electrodes on a second region of the substrate so that the second group of gate electrodes are sparsely arranged;
forming a first dielectric film as a single layer on the first region and the second region of the substrate on which the gate electrodes are formed so that the first dielectric film fills entire spaces between the gate electrodes, the first dielectric film including phosphorus;
heating the first dielectric film;
planarizing the first dielectric film after the heating of the first dielectric film;
forming a second dielectric film on the planarized first dielectric film, the second dielectric film comprising a non-doped oxide film; and then
forming contact holes to a uniform depth through the first dielectric film and the second dielectric film,
wherein planarizing the first dielectric film results in the first dielectric film having a uniform thickness at those portions through which said contact holes are formed.

31. The method of claim 30, wherein a distance between at least two adjacent gate electrodes formed on the first region is 0.3 µm or less.

32. The method of claim 30, wherein substantially an entire surface of the first dielectric film is continuous and higher than a top surface of the first, second and third gate electrodes just prior to planarizing the first dielectric film.

33. The method of claim 30, wherein the first dielectric film is planarized by CMP.

34. The method of claim 30, wherein planarizing the first dielectric film results in the entire surface of the first dielectric film being higher than the top surface of the gate electrodes.

35. The method of claim 30, wherein the first dielectric film is one selected from the group consisting of: a BPSG film, a PSG film, a BSG film, an oxide film which is formed by coating, a low dielectric constant film, an organic film, and a porous film.

36. The method of claim 30, wherein the second dielectric film is a TEOS film or a silicon notride film.

37. The method of claim 30, wherein an etching rate of the first dielectric film is higher than an etching rate of the second dielectric film.

38. A method for forming a semiconductor device comprising:
forming a first gate electrode, a second gate electrode adjacent the first gate electrode, and a third gate electrode adjacent the second gate electrode, on a substrate;
forming a first dielectric film as a single layer on the substrate so that the first dielectric film fills an entire space between the first and second gate electrodes and an entire space between the second and third gate electrodes;
planarizing a surface of the first dielectric film;
forming a second dielectric film on the surface of the first dielectric film, the second dielectric film having an etching rate different from an etching rate of the first dielectric film; and then
forming contact holes to a uniform depth through the first dielectric film and the second dielectric film;
wherein a distance between the first gate electrode and the second gate electrode is greater than a distance between the second gate electrode and the third gate electrode, and
wherein an entire surface of the first dielectric film is continuous and higher than a top surface of the first, second and third gate electrodes just prior to planarizing the first dielectric film, and
wherein planarizing the surface of the first dielectric film results in the first dielectric film having a uniform thickness at those portions through which said contact holes are formed.

39. The method of claim 38, wherein the first dielectric film includes phosphorus.

40. The method of claim 38, wherein the second dielectric film is a non-doped oxide film.

41. The method of claim 38, wherein the contact is connected to the substrate, or to one of the first, second and third gate electrodes.

42. The method of claim 38, wherein the distance between the second gate electrode and the third gate electrode is 0.3μm or less.

43. The method of claim 38, further comprising planarizing the second dielectric film before forming the contact.

44. The method of claim 38, further comprising heating the first dielectric film before the planarizing of the first dielectric film.

45. The method of claim 38, wherein a space between the first gate electrode and the second gate electrode, and a space between the second gate electrode and the third gate electrode, are filled with the first dielectric film.

46. The method of claim 38, wherein the second dielectric film is formed on the first dielectric film before forming a precipitate on a surface of the first dielectric film, and after the planarizing of the first dielectric film.

47. The method of claim 38, wherein the forming the second dielectric film on the first dielectric film is performed within 24 hours after the planarizing the first dielectric film.

48. The method of claim 38, further comprising eliminating a precipitate on a surface of the first dielectric film after planarizing the first dielectric film.

49. The method of claim 48, wherein the precipitate is eliminated by using a solution.

50. The method of claim 38, wherein the contact is composed of a conductive film.

51. The method of claim 38, wherein the second dielectric film is a non-doped oxide film.

52. The method of claim 38, wherein the first dielectric film is planarized by CMP.

53. The method of claim 38, wherein planarizing the first dielectric film results in the entire surface of the first dielectric film continuing to be higher than the top surface of the first, second and third gate electrodes.

54. The method of claim 38, wherein the first dielectric film is one selected from the group consisting of: a BPSG film, a PSG film, a BSG film, an oxide film which is formed by coating, a low dielectric constant film, an organic film, and a porous film.

55. The method of claim 38, wherein the second dielectric film is a TEOS film or a silicon nitride film.

56. The method of claim 38, wherein the etching rate of the first dielectric film is higher than the etching rate of the second dielectric film.

57. A method for forming a semiconductor device comprising:

forming a first interconnection, a second interconnection adjacent the first interconnection, and a third interconnection adjacent the second interconnection, on a substrate;

forming a first dielectric film as a single layer on the substrate so that the first dielectric film fills an entire space between the first and second interconnections and an entire space between the second and third interconnections;

planarizing a surface of the first dielectric film;

forming a second dielectric film on the surface of the first dielectric film, the second dielectric film having an etching rate differnt from an etching rate of the first dielectric film; and then forming contact holes to a uniform depth through the first dielectric film and the second dielectric film;

wherein a distance between the first interconnection and the second interconnection is greater than a distance between the second interconnection and the third interconnection, and wherein an entire surface of the first dielectric film is continuous and higher than a top surface of the first, second and third interconnections just prior to planarizing the first dielectric film, and wherein planarizing the surface of the first dielectric film results in th first dielectric film having a uniform thickness at those portions through which said contact holes are formed.

58. The method of claim 57, wherein the first dielectric film includes phosphorus.

59. The method of claim 57, wherein the etching rate of the first dielectric film is higher than the etching rate of the second dielectric film.

60. The method of claim 57, wherein the second dielectric film is a non-doped oxide film.

61. The method of claim 57, wherein the contact is connected to the substrate or to one of the first, second and third interconnections.

62. The method of claim 57, wherein the distance between the second interconnection and the third interconnection is 0.3 μm or less.

63. The method of claim 57, further comprising planarizing the second dielectric film before forming the contact.

64. The method of claim 57, wherein a space between the first interconnection and the second interconnection, and a space between the second interconnection and the third interconnection, are filled with the first dielectric film.

65. The method of claim 57, wherein the first dielectric film is planarized by CMP.

66. The method of claim 57, wherein planarizing the first dielectric film results in the entire surface of the first dielectric film continuing to be higher than the top surface of the first, second and third interconnections.

67. The method of claim 57, wherein the first dielectric film is one selected from the group consisting of: a BPSG film, a PSG film, a BSG film, an oxide film which is formed by coating, a low dielectric constant film, an organic film, and a porous film.

68. The method of claim 57, wherein the second dielectric film is a TEOS film or a silicon nitride film.

* * * * *

UNITED STATES PATENT AND TRADEMARK OFFICE
CERTIFICATE OF CORRECTION

PATENT NO. : 7,316,972 B2  
APPLICATION NO. : 10/630681  
DATED : January 8, 2008  
INVENTOR(S) : Tetsuya Matsutani It is certified that error appears in the above-identified patent and that said Letters Patent is hereby corrected as shown below:

In claim 9, column 12, line 10, "pf" should be --of--.

In claim 29, column 13, line 50, "than the the etching" should be --than the etching--.

In claim 36, column 14, line 28, "notride" should be --nitride--.

In claim 57, column 16, line 4, "difernt" should be --different--.

Signed and Sealed this

Thirteenth Day of May, 2008

JON W. DUDAS  
*Director of the United States Patent and Trademark Office*